(12) United States Patent
Mutou et al.

(10) Patent No.: US 12,137,544 B2
(45) Date of Patent: *Nov. 5, 2024

(54) WAVE ABSORBER

(71) Applicant: SEKISUI CHEMICAL CO., LTD., Osaka (JP)

(72) Inventors: Katsunori Mutou, Aichi (JP); Sachiko Nakao, Aichi (JP); Hideki Hayashi, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 523 days.

This patent is subject to a terminal disclaimer.

(21) Appl. No.: 17/413,739

(22) PCT Filed: Dec. 25, 2019

(86) PCT No.: PCT/JP2019/050884
§ 371 (c)(1),
(2) Date: Jun. 14, 2021

(87) PCT Pub. No.: WO2020/138194
PCT Pub. Date: Jul. 2, 2020

(65) Prior Publication Data
US 2022/0071071 A1    Mar. 3, 2022

(30) Foreign Application Priority Data

Dec. 25, 2018  (JP) ................................. 2018-241069
Dec. 25, 2018  (JP) ................................. 2018-241074

(51) Int. Cl.
*H05K 9/00*    (2006.01)
*H01Q 17/00*    (2006.01)

(52) U.S. Cl.
CPC .......... *H05K 9/0088* (2013.01); *H01Q 17/00* (2013.01)

(58) Field of Classification Search
CPC ............................ H05K 9/0088; H01Q 17/00
See application file for complete search history.

(56) References Cited

U.S. PATENT DOCUMENTS

| | | | |
|---|---|---|---|
| 5,537,116 A * | 7/1996 | Ishino | H01Q 17/00 342/1 |
| 2018/0198006 A1* | 7/2018 | Greer | H10K 71/12 |
| 2018/0319138 A1* | 11/2018 | Ukei | B32B 27/30 |

FOREIGN PATENT DOCUMENTS

| | | |
|---|---|---|
| JP | 2003-96413 | 4/2003 |
| JP | 2003-198179 | 7/2003 |

(Continued)

OTHER PUBLICATIONS

Anonymous-"Substrate's Dynes/Cm", Oct. 22, 2017, pp. 1-2 (Year: 2017).*

(Continued)

*Primary Examiner* — Vladimir Magloire
*Assistant Examiner* — Noah Yi Min Zhu
(74) *Attorney, Agent, or Firm* — Wenderoth, Lind & Ponack, L.L.P.

(57) ABSTRACT

An object of the present invention is to provide a radio wave absorber having excellent radio wave absorption against oblique incidence, particularly against oblique incidence of radio waves at around 79 GHz. The object can be achieved by a radio wave absorber having characteristic A: an absorption range with absorption performance of 15 dB or more within the frequency band of 75 to 85 GHz of 4 GHz or more in a TM polarization measurement at 45° incidence and/or characteristic B: an absorption range with absorption performance of 15 dB or more within the frequency band of 75 to 85 GHz of 4 GHz or more in a TE polarization measurement at 45° incidence.

16 Claims, 1 Drawing Sheet

(56) References Cited

FOREIGN PATENT DOCUMENTS

| | | |
|---|---|---|
| JP | 2015-152821 | 8/2015 |
| JP | 2018-56562 | 4/2018 |
| JP | 2018-98367 | 6/2018 |

OTHER PUBLICATIONS

Hiroyuki Arikawa, Koichi Fujii, Takahito Kanie, Kastuichiro Inoue, Light transmittance characteristics of light-cured composite resins, Dental Materials, vol. 14, Issue 6, 1998, pp. 405-411, ISSN 0109-5641 (Year: 1998).*
Anonymous-"Substrate's Dynes/Cm", Oct. 22, 2017, pp. 1-2.
Extended European Search Report issued Aug. 25, 2022 in corresponding European Patent Application No. 19903124.6.
International Search Report issued Mar. 17, 2020 in International (PCT) Application No. PCT/JP2019/050884.
Notice of Reasons of Refusal issued Sep. 15, 2020 in corresponding Japanese Application No. 2020-514630, with English translation.
Decision of Refusal issued Jan. 26, 2021 in corresponding Japanese Application No. 2020-514630, with English translation.

* cited by examiner

WAVE ABSORBER

TECHNICAL FIELD

The present invention relates to a radio wave absorber and a relevant item.

BACKGROUND ART

Mobile communication devices such as cellular phones and smartphones have rapidly become widespread. Automobiles, for example, have been equipped with many electronic devices. However, due to radio waves and noise generated from these devices, radio disturbances or malfunctions of other electronic devices frequently occur. To prevent these problems, such as radio disturbances and malfunctions, various radio wave absorbers have been studied. For example, PTL 1 discloses an electromagnetic wave absorber that has a bandwidth of 2 GHz or more in a frequency band of which the absorption of electromagnetic waves is 20 dB or more within the frequency band of 60 to 90 GHz.

CITATION LIST

Patent Literature

PTL 1: JP2018-098367A

SUMMARY OF INVENTION

Technical Problem

Depending on their applications, radio wave absorbers sometimes cannot be positioned in such a manner that radio waves are made incident from the normal direction. In such a case, radio wave absorption against oblique incidence is important. The present inventors conducted research focusing on this point, and found that the conventional wave absorbers can handle radio waves incident from the normal direction, but cannot sufficiently absorb oblique incident radio waves.

Accordingly, the present invention aims to provide a wave absorber that has excellent radio wave absorption against oblique incidence. In particular, the present invention aims to provide a radio wave absorber that has excellent radio wave absorption against oblique incidence of radio waves at around 79 GHz.

Solution to Problem

In the course of the research, the present inventors found that by optimizing a characteristic at 45° incidence, excellent radio wave absorption against incidence from various angles is exhibited. Based on this finding, the present inventors conducted further extensive research, and as a result, they found that a radio wave absorber having an absorption range with absorption performance of 15 dB or more within the frequency band of 75 to 85 GHz of 4 GHz or more in a TM polarization measurement at 45° incidence (characteristic A), and/or an absorption range with absorption performance of 15 dB or more within the frequency band of 75 to 85 GHz of 4 GHz or more in a TE polarization measurement at 45° incidence (characteristic B) can solve the above problem. The inventors conducted further research based on this finding and accomplished the present invention.

Specifically, the present invention includes the following embodiments.

Item 1. A radio wave absorber having characteristic A: an absorption range with absorption performance of 15 dB or more within the frequency band of 75 to 85 GHz of 4 GHz or more in a TM polarization measurement at 45° incidence and/or characteristic B: an absorption range with absorption performance of 15 dB or more within the frequency band of 75 to 85 GHz of 4 GHz or more in a TE polarization measurement at 45° incidence.

Item 2. The radio wave absorber according to Item 1, comprising a resistive film, a dielectric layer, and a reflective layer.

Item 3. The radio wave absorber according to Item 2, wherein the radio wave absorber has characteristic A, and the resistive film has a resistance value of 175Ω/□ to 360 Ω/□.

Item 4. The radio wave absorber according to Item 2, wherein the radio wave absorber has characteristic B, and the resistive film has a resistance value of 355Ω/□ to 690 Ω/□.

Item 5. The radio wave absorber according to Item 2 or 3, wherein the radio wave absorber has characteristic A and satisfies formula (1A): $700 \leq d \times \sqrt{\varepsilon} \leq 1150$, wherein d represents the thickness (μm) of the dielectric layer and ε represents the relative permittivity of the dielectric layer.

Item 6. The radio wave absorber according to Item 2 or 4, wherein the radio wave absorber has characteristic B and satisfies formula (1B): $682 \leq d \times \sqrt{\varepsilon} \leq 960$, wherein d represents the thickness (μm) of the dielectric layer and ε represents the relative permittivity of the dielectric layer.

Item 7. The radio wave absorber according to any one of Items 2 to 6, wherein the dielectric layer has a relative permittivity of 1 to 10.

Item 8. The radio wave absorber according to any of one of Items 2 to 7, wherein the resistive film comprises a barrier layer.

Item 9. The radio wave absorber according to any one of Items 2 to 8, wherein the resistive film contains molybdenum.

Item 10. The radio wave absorber according to Item 9, wherein the resistive film further contains nickel and chromium.

Item 11. The radio wave absorber according to any one of Items 2 to 10, wherein the surface of the reflective layer facing the dielectric layer has a surface roughness (Rz) of 1 μm or more and 10 μm or less.

Item 12. The radio wave absorber according to any one of Items 2 to 11, further comprising a support, wherein the top surface of the radio wave absorber facing the support has a surface tension of 35 dyn/cm or more.

Item 13. The radio wave absorber according to Item 12, wherein the support has a total light transmittance of 30% or less.

Item 14. A λ/4 radio wave absorber member comprising a resistive film and a dielectric layer, the λ/4 radio wave absorber member having characteristic A: an absorption range with absorption performance of 15 dB or more within the frequency band of 75 to 85 GHz of 4 GHz or more in a TM polarization measurement at 45° incidence when an aluminum plate with a thickness of 10 μm is stacked on the other side of the dielectric layer, and/or characteristic B: an absorption range with absorption performance of 15 dB or more within the frequency band of 75 to 85 GHz of 4 GHz or more in a TE polarization measurement at 45° incidence when an aluminum plate with a thickness of 10 μm is stacked on the other side of the dielectric layer.

Advantageous Effects of Invention

The present invention can provide a radio wave absorber having excellent radio wave absorption against oblique incidence, particularly against oblique incidence of radio waves at around 79 GHz.

DESCRIPTION OF EMBODIMENTS

Figure 1:
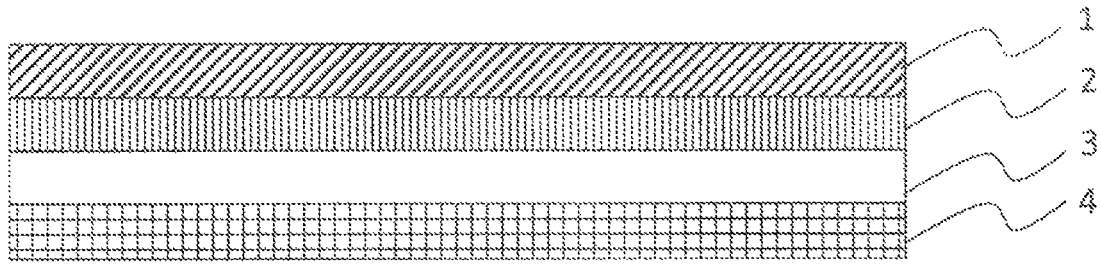
FIG. 1 illustrates the schematic cross section of the radio wave absorber according to an embodiment of the present invention.
Figure 2:
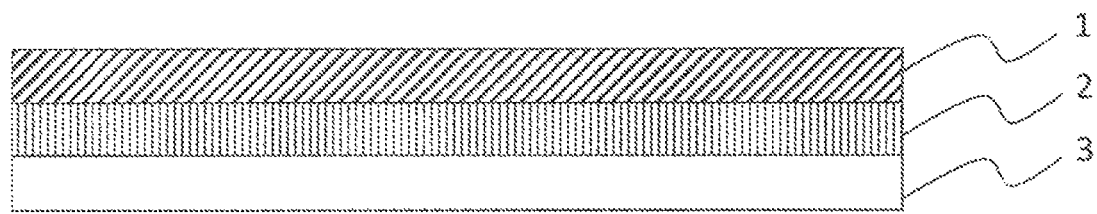
FIG. 2 illustrates on the upper side the schematic cross section of the radio wave absorber member according to an embodiment of the present invention, and on the lower side the schematic cross section of an adherend that is arranged so that the radio wave absorber member comes into contact with the adherend, and that functions as a reflective layer in an embodiment of the invention.
Figure 2:
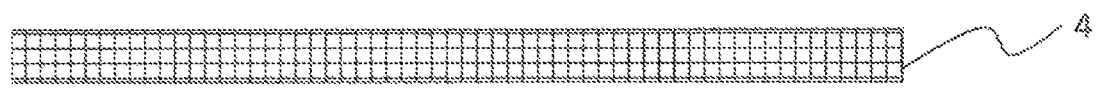
Figure 3:
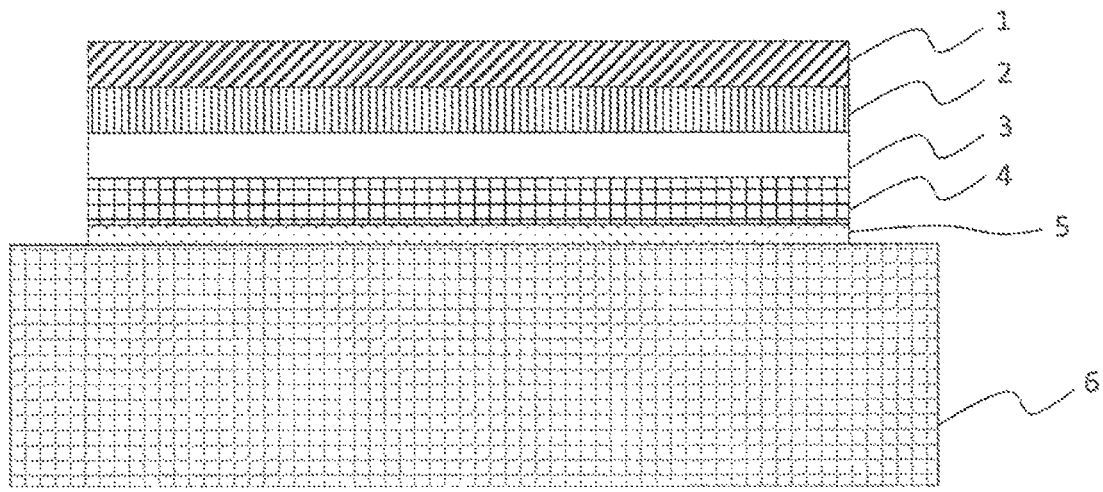
FIG. 3 illustrates a schematic cross section that illustrates an application of the radio wave absorber according to an embodiment of the present invention. (In this embodiment, the radio wave absorber is disposed on a chassis through an adhesive.)

In the present specification, the terms "comprise," "contain," and "include" includes the concepts of comprising, containing, including, consisting essentially of, and consisting of.

In one embodiment, the present invention relates to a radio wave absorber (sometimes referred to as "radio wave absorber of the present invention" in this specification) having characteristic A: an absorption range with absorption performance of 15 dB or more within the frequency band of 75 to 85 GHz of 4 GHz or more in a TM polarization measurement at 45° incidence, and/or characteristic B: an absorption range with absorption performance of 15 dB or more within the frequency band of 75 to 85 GHz of 4 GHz or more in a TE polarization measurement at 45° incidence. The details are explained below. The radio wave absorber having characteristic A is sometimes referred to as "the radio wave absorber A of the present invention," and the radio wave absorber having characteristic B is sometimes referred to as "the radio wave absorber B of the present invention."

1. Characteristics

The radio wave absorber of the present invention has characteristics, i.e., characteristic A: an absorption range with absorption performance of 15 dB or more within the frequency band of 75 to 85 GHz of 4 GHz or more in a TM polarization measurement at 45° incidence, and/or characteristic B: an absorption range with absorption performance of 15 dB or more within the frequency band of 75 to 85 GHz of 4 GHz or more in a TE polarization measurement at 45° incidence (in this specification, sometimes referred to as the "characteristics of the present invention"). Such characteristics enable the radio wave absorber of the present invention to exhibit excellent radio wave absorption against incidence from various angles.

"Absorption range with absorption performance of 15 dB or more within the frequency band of 75 to 85 GHz" means the bandwidth (GHz) of a frequency band showing absorption performance of 15 dB or more (the return loss being −15 dB or less) within the frequency band of 75 to 85 GHz.

The above absorption range can be measured by the following method.

A radio wave absorption measurement device is configured by using an N5227A PNA microwave network analyzer (produced by Keysight Technologies), an N5261A millimeter wave controller for PNA-X series 2-port (produced by Keysight Technologies), and a FSS-07 horn antenna (produced by HVS). The amount of radio wave absorption of the radio wave absorbers is measured in an E band (60 to 90 GHz) by using this radio wave absorption measurement device in accordance with JIS R1679.

A radio wave is made incident at 45° relative to the front surface of a measurement sample, and a horn antenna is set at an equal angle relative to the vertical line of the center of the surface of the measurement sample, thereby determining the return loss.

For the measurement of characteristic A, the incident wave is measured with the electric field being horizontal to the plane of incidence (TM wave).

For the measurement of characteristic B, the incident wave is measured with the electric field being perpendicular to the plane of incidence (TE wave).

The absolute value of the return loss is determined to be absorption performance.

The absorption range is preferably 5 GHz or more, more preferably 6 GHz or more, still more preferably 8 GHz or more, and yet more preferably 9.5 GHz or more. Since the above absorption range is the range within the frequency band of 75 to 85 GHz, the upper limit of the range is 10 GHz.

2. Structure

The structure of the radio wave absorber of the present invention is not particularly limited as long as it has the characteristic of the present invention mentioned above. For example, a known structure of the radio wave absorber can be used. In one embodiment, the radio wave absorber of the present invention comprises a resistive film, a dielectric layer, and a reflective layer. Specifically, in one embodiment, the radio wave absorber of the present invention is a λ/4 wave absorber. This embodiment is explained below.

2-1. Resistive Film

The resistive film is not particularly limited as long as it comprises a layer that can function as a resistive layer in radio wave absorbers.

The resistance value of the resistive film is not particularly limited as long as it can satisfy the characteristic of the present invention. By adjusting the resistance value of the resistive film, the absorption range in the characteristic of the present invention can be adjusted.

In the radio wave absorber A of the present invention, the resistance value of the resistive film is, for example, 160 to 370Ω/□. In this range, the resistance value is more preferably 175Ω/□ or more, even more preferably 200Ω/□ or more, and particularly preferably 230Ω/□ or more. In the above range, it is more preferably 360Ω/□ or less, even more preferably 320 Ω/□ or less, and particularly preferably 290Ω/□ or less.

In the radio wave absorber B of the present invention, the resistance value of the resistive film is, for example, 320 to 720Ω/□. In this range, the resistance value is more preferably 355Ω/□ or more, even more preferably 400Ω/□ or more, particularly preferably 440Ω/□ or more, and most preferably 460Ω/□ or more. In the above range, it is more preferably 690Ω/□ or less, even more preferably 600Ω/□ or less, and particularly preferably 540Ω/□ or less.

The resistance value of the resistive film can be measured by the four-terminal method using a surface resistance meter (produced by Mitsubishi Chemical Analytech Co., Ltd., product name: Loresta-EP).

The thickness of the resistive film can be any resistive value that can satisfy the present invention. The thickness of the resistive film is, for example, 1 nm or more and 200 nm or less, preferably 2 nm or more and 100 nm or less, and more preferably 2 nm or more and 50 nm or less.

The layer structure of the resistive film is not particularly limited. The resistive film may be composed of a single layer or a combination of two or more layers.

2-1-1. Resistive Layer 2-1-1-1. ITO-Containing Resistive Layer The resistive layer for use is, for example, indium tin oxide ("ITO" below). In particular, a resistive layer containing ITO that contains 1 to 40 wt %, more preferably 2 to 35 wt % of $SnO_2$, is preferable for use from the standpoint of the highly stable amorphous structure and suppressed changes in sheet resistance of the resistive layer in hot and humid conditions. In the resistive layer, the amount of ITO is for example 50 mass % or more, preferably 70 mass % or more, more preferably 90 mass % or more, and still more preferably 95 mass % or more, and typically less than 100 mass %).

2-1-1-2. Molybdenum-Containing Resistive Layer

The resistive layer for use preferably contains molybdenum from the standpoint of durability and the ease of adjusting sheet resistance. The lower limit of the content of molybdenum is not particularly limited; from the standpoint of increasing durability, the lower limit of the content of molybdenum is preferably 5 wt %, more preferably 7 wt %, still more preferably 9 wt %, yet more preferably 11 wt %, particularly preferably 13 wt %, very preferably 15 wt %, and most preferably 16 wt %. The upper limit of the content of molybdenum is preferably 70 wt %, more preferably 30 wt %, still more preferably 25 wt %, and even more preferably 20 wt % from the standpoint of the ease of adjusting the value of surface resistance.

More preferably, the resistive layer that contains molybdenum further contains nickel and chromium. A resistive layer containing nickel and chromium in addition to molybdenum leads to a radio wave absorber with excellent durability. Examples of alloy containing nickel, chromium, and molybdenum include a variety of alloy grades such as Hastelloy B-2, B-3, C-4, C-2000, C-22, C-276, G-30, N, W, and X.

The resistive layer containing molybdenum, nickel, and chromium preferably contains molybdenum in an amount of 5 wt % or more, nickel in an amount of 40 wt % or more, and chromium in an amount of 1 wt % or more. The resistive film containing molybdenum, nickel, and chromium in amounts within these ranges leads to a radio wave absorber with further improved durability. The resistive film more preferably contains molybdenum in an amount of 7 wt % or more, nickel in an amount of 45 wt % or more, and chromium in an amount of 3 wt % or more. The resistive film still more preferably contains molybdenum in an amount of 9 wt % or more, nickel in an amount of 47 wt % or more, and chromium in an amount of 5 wt % or more. The resistive film yet more preferably contains molybdenum in an amount of 11 wt % or more, nickel in an amount of 50 wt % or more, and chromium in an amount of 10 wt % or more. The resistive film particularly preferably contains molybdenum in an amount of 13 wt % or more, nickel in an amount of 53 wt % or more, and chromium in an amount of 12 wt % or more. The resistive film very preferably contains molybdenum in an amount of 15 wt % or more, nickel in an amount of 55 wt % or more, and chromium in an amount of 15 wt % or more. The resistive film most preferably contains molybdenum in an amount of 16 wt % or more, nickel in an amount of 57 wt % or more, and chromium in an amount of 16 wt % or more. Additionally, the nickel content in the resistive film is preferably 80 wt % or less, more preferably 70 wt % or less, and still more preferably 65 wt % or less. The upper limit of the chromium content is preferably 50 wt % or less, more preferably 40 wt % or less, and still more preferably 35 wt % or less.

The resistive layer may further contain metals other than molybdenum, nickel, or chromium. Examples of such metals include iron, cobalt, tungsten, manganese, and titanium. The upper limit of the total content of metals other than molybdenum, nickel, and chromium in the resistive layer containing molybdenum, nickel, and chromium is preferably 45 wt %, more preferably 40 wt %, still more preferably 35 wt %, yet more preferably 30 wt %, particularly preferably 25 wt %, and very preferably 23 wt % from the standpoint of durability of the resistive layer. The lower limit of the total content of metals other than molybdenum, nickel, and chromium is, for example, 1 wt % or more.

When the resistive layer contains iron, the upper limit of the content of iron is preferably 25 wt %, more preferably 20 wt %, and still more preferably 15 wt %, with the lower limit being preferably 1 wt % from the standpoint of durability of the resistive layer. When the resistive layer contains cobalt and/or manganese, the upper limit of the content of each metal is independently preferably 5 wt %, more preferably 4 wt %, and still more preferably 3 wt %, with the lower limit being preferably 0.1 wt % from the standpoint of durability of the resistive layer. When the resistive layer contains tungsten, the upper limit of the content of tungsten is preferably 8 wt %, more preferably 6 wt %, and still more preferably 4 wt %, with the lower limit being preferably 1 wt % from the standpoint of durability of the resistive layer.

The resistive layer may contain silicon and/or carbon. The resistive layer containing silicon and/or carbon contains silicon and/or carbon in an individual amount of preferably 1 wt % or less, and more preferably 0.5 wt % or less.

The resistive layer containing silicon and/or carbon contains silicon and/or carbon in an individual amount of preferably 0.01 wt % or more.

The resistance value of the resistive layer can be any value that satisfies the characteristic of the present invention described below. By adjusting the resistance value of the resistive layer, the absorption range in the characteristic of the present invention can be adjusted.

In the radio wave absorber A of the present invention, the resistance value of the resistive layer is, for example, 160 Ω/□ to 370Ω/□. In this range, it is preferably 175Ω/□ to 360 Ω/□, more preferably 200Ω/□ to 320Ω/□, and particularly preferably 230Ω/□ to 290 Ω/□.

In the radio wave absorber B of the present invention, the resistance value of the resistive layer is, for example, 320 Ω/□ to 720Ω/□. In this range, it is preferably 355Ω/□ to 690 Ω/□, more preferably 400Ω/□ to 600Ω/□, and particularly preferably 440Ω/□ to 540 Ω/□.

The thickness of the resistive layer can be any thickness that gives a resistance value that satisfies the characteristic of the present invention. The thickness of the resistive layer is, for example, 1 nm or more and 200 nm or less, preferably 2 nm or more and 100 nm or less, and more preferably 2 nm or more and 50 nm or less.

The layer structure of the resistive layer is not particularly limited. The resistive layer may be composed of a single resistive layer or a combination of two or more resistive layers.

2-1-2. Barrier Layer

From the standpoint of durability, the resistive film preferably includes a barrier layer. The barrier layer is disposed on at least one surface of the resistive layer. The barrier layer is described in detail below.

The barrier layer can be any layer that can protect the resistive layer and that can suppress degradation of the resistive film. The material for the barrier layer can be, for example, a metal compound, and a metalloid compound, and preferably an oxide of a metal or metalloid, a nitride, and a nitride oxide. The barrier layer may contain components other than these materials to the extent that the effect of the present invention is not significantly impaired. In this case, the content of the material described above in the barrier layer is, for example, 80 mass % or more, preferably 90 mass % or more, more preferably 95 mass % or more, and still more preferably 99 mass % or more, and typically less than 100 mass %.

Examples of metal elements contained in the barrier layer include titanium, aluminum, niobium, cobalt, and nickel. Examples of metalloid elements contained in the barrier layer include silicon, germanium, antimony, and bismuth.

Examples of oxides of a metal or metalloid element include compounds represented by $MO_x$ wherein X represents a number that satisfies the formula: $n/100 \leq X \leq n/2$ (n representing the valence of a metal or metalloid element), and M represents a metal or metalloid element.

Examples of nitrides include compounds represented by $MN_y$, wherein Y represents a number that satisfies the formula: $n/100 \leq Y \leq n/3$ (n representing the valence of a metal or metalloid), and M represents a metal or metalloid element.

Examples of nitride oxides include compounds represented by $MO_xN_y$, wherein X and Y satisfy the following: $n/100 \leq X$, $n/100 \leq Y$, and $X+Y \leq n/2$ (n representing the valence of a metal or metalloid), and M represents a metal or metalloid element.

Regarding the oxidation number X of an oxide or nitride oxide, for example, elemental analysis of the cross-sectional surface of a layer containing $MO_x$ or $MO_xN_y$ is performed with an FE-TEM-EDX (e.g., JEM-ARM200F produced by JEOL Ltd.), and then X is calculated from the element ratio of M and O per area of the cross-sectional surface of the layer containing $MO_x$ or $MO_xN_y$. From this calculation, the valence of the oxygen atom can be determined.

Regarding the nitridation number Y of a nitride or nitride oxide, for example, elemental analysis of the cross-sectional surface of a layer containing $MN_y$ or $MO_xN_y$ is performed with an FE-TEM-EDX (e.g., JEM-ARM200F produced by JEOL Ltd.), and then Y is calculated from the element ratio of M and N per area of the cross-sectional surface of the layer containing $MN_y$ or $MO_xN_y$. From this calculation, the valence of the nitrogen atom can be determined.

Specific examples of materials of the barrier layer include $SiO_2$, $SiO_x$, $Al_2O_3$, $MgAl_2O_4$, CuO, CuN, $TiO_2$, TiN, and AZO (aluminum-doped zinc oxide).

The thickness of the barrier layer can be any thickness. The barrier layer has a thickness of, for example, 1 nm or more and 200 nm or less, preferably 1 nm or more and 100 nm or less, and more preferably 1 nm or more and 20 nm or less.

The layer structure of the barrier layer is not particularly limited. The barrier layer may be composed of a single barrier layer or a combination of two or more barrier layers.

2-2. Dielectric Layer

The dielectric layer can be any dielectric layer that can function as a dielectric for a target wavelength in a radio wave absorber. Examples of dielectric layers include, but are not limited to, resin sheets and adhesives.

The resin sheet can be any resin in sheet form that contains resin as a material. The resin sheet may contain components other than resin to the extent that the effect of the present invention is not significantly impaired. In this case, the total content of resin in the resin sheet is, for example, 50 mass % or more, preferably 70 mass % or more, more preferably 90 mass % or more, and still more preferably 95 mass % or more, and typically less than 100 mass %.

The resin can be any resin, and the resin for use as a resin component is, for example, preferably a synthetic resin, such as ethylene vinyl acetate copolymers (EVA), vinyl chloride, urethane, acrylic, acrylic urethane, polyolefin, polyethylene, polypropylene, silicone, polyethylene terephthalate, polyester, polystyrene, polyimide, polycarbonate, polyamide, polysulfone, polyethersulfone, and epoxy; and a synthetic rubber material, such as polyisoprene rubber, polystyrene-butadiene rubber, polybutadiene rubber, chloroprene rubber, acrylonitrile-butadiene rubber, butyl rubber, acrylic rubber, ethylene-propylene rubber, and silicone rubber. These resins can be used singly or in a combination of two or more.

The dielectric layer may be a foam or adhesive.

The dielectric layer may have adhesiveness. Thus, when a dielectric with no adhesiveness is stacked on another layer through an adhesive layer, the combination of the dielectric and the adhesive layer forms a dielectric layer. From the standpoint of the ease of stacking a dielectric layer on an adjacent layer, the dielectric layer preferably contains an adhesive layer.

The relative permittivity of the dielectric layer can be any value that satisfies the characteristic of the present invention. By adjusting the relative permittivity of the dielectric layer (particularly, thereby, by adjusting the value of formula (1), the absorption range in the characteristic of the present invention can be adjusted. The relative permittivity of the dielectric layer is, for example, 1 to 20, preferably 1 to 15, more preferably 1 to 10, and even more preferably 1 to 5.

The thickness of the dielectric layer can be any thickness that satisfies the characteristic of the present invention. By adjusting the relative permittivity of the dielectric layer (particularly, thereby, by adjusting the value of formula (1)), the absorption range in the characteristic of the present invention can be adjusted.

In the radio wave absorber A of the present invention, the thickness of the dielectric layer is, for example, 300 to 1300 μm, preferably 470 to 760 μm, and more preferably 520 to 680 μm.

In the radio wave absorber B of the present invention, the thickness of the dielectric layer is, for example, 200 to 1200 μm, preferably 420 to 620 μm, and more preferably 470 to 590 μm.

For the dielectric layer, as a means for adjusting the absorption range in characteristic A, the radio wave absorber preferably satisfies formula (1): $700 \leq d \times \sqrt{\varepsilon} \leq 1150$, wherein d represents the thickness (μm) of the dielectric layer and ε represents the relative permittivity of the dielectric layer. The lower limit of $d \times \sqrt{\varepsilon}$ is preferably 750, more preferably 820, and particularly preferably 880. The upper limit of $d \times \sqrt{\varepsilon}$ is preferably 1150, more preferably 1050, and even more preferably 980.

For the dielectric layer, as a means for adjusting the absorption range in characteristic B, the radio wave absorber preferably satisfies formula (1):682≤d×√ε≤960, wherein d represents the thickness (μm) of the dielectric layer and ε represents the relative permittivity of the dielectric layer. The lower limit of d×√ε is preferably 720, more preferably 750, particularly preferably 770, and most preferably 775. The upper limit of d×√ε is preferably 930, more preferably 900, and particularly preferably 870.

If the dielectric layer comprises multiple layers, the value d×√ε is calculated by determining the value of each layer and adding up these values. For example, when the dielectric layer comprises dielectric layer 1 and dielectric layer 2 (e.g., adhesive tape), "d×√ε" is calculated by adding up "the thickness of dielectric layer 1×(relative permittivity of dielectric layer 1) 0.5" and "the thickness of dielectric layer 2×(relative permittivity of dielectric layer 2) 0.5".

The thickness of the dielectric layer can be measured with an MS-11C measurement stand and a DIGIMICRO MFC-101 counter (Nikon Corporation).

The relative permittivity of the dielectric layer can be determined by measuring relative permittivity at 10 GHz by the cavity perturbation method with, for example, a network analyzer or cavity resonator.

The layer structure of the dielectric layer is not particularly limited. The dielectric layer may be composed of a single dielectric layer or a combination of two or more dielectric layers. Examples include a dielectric layer with a three-layered structure that includes a non-adhesive dielectric and an adhesive layer disposed on each surface of the non-adhesive dielectric, and a dielectric layer with a monolayer structure that includes an adhesive dielectric.

2-3. Reflective Layer

The reflective layer can be any layer that functions as a reflective layer for radio waves in a radio wave absorber. Examples of reflective layers include, but are not limited to, metal films.

The metal film can be any metal film that contains metal as a material. The metal film may contain components other than metal to the extent that the effect of the present invention is not significantly impaired. In this case, the total content of metal in the metal film is, for example 30 mass % or more, preferably 50 mass % or more, more preferably 75 mass % or more, still more preferably 80 mass % or more, yet more preferably 90 mass % or more, particularly preferably 95 mass % or more, and very preferably 99 mass % or more, and typically less than 100 mass %.

The metal can be any metal. Examples of metals include aluminum, copper, iron, silver, gold, chromium, nickel, molybdenum, gallium, zinc, tin, niobium, and indium. Metal compounds, such as ITO, are also usable as a material of metal films. These metals can be used singly or in a combination of two or more.

The thickness of the reflective layer is not particularly limited. The thickness of the reflective layer is, for example, 1 μm or more and 500 μm or less, preferably 2 μm or more and 200 μm or less, and more preferably 5 μm or more and 100 μm or less.

In a preferable embodiment of the present invention, the surface of the reflective layer facing the dielectric layer preferably has a surface roughness (Rz) of 1 μm or more and 10 μm or less. A surface roughness within this range enables the dielectric layer and the reflective layer to adhere well to each other and enables the radio wave absorber to exhibit further improved radio wave absorption. The surface roughness (Rz) is preferably 1 μm or more and 8 μm or less, and more preferably 1 μm or more and 5 μm or less.

In a preferable embodiment of the present invention, the surface of the reflective layer not facing the dielectric layer has a surface roughness (Rz) of 1 μm or more. This enables the reflective layer to adhere well with a layer (e.g., an adhesive layer) stacked on the surface of the reflective layer not facing the dielectric layer, and makes it easier to attach the radio wave absorber according to the present invention to another member (e.g., a device in an automobile). This surface roughness (Rz) is preferably 30 μm or less, and more preferably 2 μm or more and 15 μm or less.

The surface roughness (Rz) of the reflective layer can be measured as described below. The surface roughness (Rz) can be estimated by measuring the unevenness on the surface of the reflective layer with a color 3D laser scanning microscope (VK8710, produced by Keyence Corporation, or similar equipment). Specifically, Rz in an area of 10 μm×10 μm on the surface of a reflective layer is measured at 5 randomly selected points with a 50× objective lens in accordance with JIS B0601:2001, and the average is calculated to determine the surface roughness (Rz).

The surface roughness (Rz) of the reflective layer can be adjusted in accordance with or based on a known method for adjusting the surface roughness. For example, the surface roughness (Rz) of the reflective layer can be adjusted by adding fine metal particles by a metal plating technique or by scraping the surface by a physical or chemical technique.

The layer structure of the reflective layer is not particularly limited. The reflective layer may be composed of a single reflective layer or a combination of two or more reflective layers.

2-4. Support

When the radio wave absorber of the present invention has a resistive film, the present invention preferably has a support. This protects the resistive film and increases the durability of the radio wave absorber.

The support can be any material in sheet form. Examples of supports include, but are not limited to, resin base materials.

The resin base material refers to a base material that contains resin as a material, and can be any resin material in sheet form. The resin base material may contain components other than resin to the extent that the effect of the present invention is not significantly impaired. For example, from the standpoint of adjusting relative permittivity, the resin base material may contain titanium oxide. In this case, the total content of resin in the resin base material is, for example, 80 mass % or more, preferably 90 mass % or more, more preferably 95 mass % or more, and still more preferably 99 mass % or more, and typically less than 100 mass %.

Examples of resins include, but are not limited to, polyester-based resins, such as polyethylene terephthalate (PET), polyethylene naphthalate, and modified polyester; polyolefin resins, such as polyethylene (PE) resin, polypropylene (PP) resin, polystyrene resin, and cyclic olefin-based resins; vinyl-based resins, such as polyvinyl chloride and polyvinylidene chloride; polyvinyl acetal resins, such as polyvinyl butyral (PVB); polyether ether ketone (PEEK) resin, polysulfone (PSF) resin, polyether sulfone (PES) resin, polycarbonate (PC) resin, polyamide resin, polyimide resin, acrylic resin, and triacetyl cellulose (TAC) resin. These resins can be used singly or in a combination of two or more.

Of these, from the standpoint of productivity and strength, polyester-based resins are preferable, and polyethylene terephthalate is more preferable.

The relative permittivity of the support can be any value. The relative permittivity of the support is, for example, 1 to 20, 1 to 15, more preferably 1 to 10, and even more preferably 1 to 5.

The thickness of the support is not particularly limited. The thickness of the support is, for example, 5 μm or more and 500 μm or less, preferably 10 μm or more and 300 μm or less, and more preferably 20 μm or more and 300 μm or less.

In a preferable embodiment of the present invention, the surface tension of the top surface of the radio wave absorber facing the support (usually the surface of the support not facing the restrictive film) is preferably 35 dyn/cm or more. When the surface tension takes such a value, the radio wave absorber exhibits excellent anti-staining properties. As a result, even after wiping off stains, the radio wave absorber attains excellent radio wave absorption. The surface tension is more preferably 36 dyn/cm or more.

The upper limit of the surface tension is not particularly limited, but it is preferably 60 dyn/cm or less, more preferably 57 dyn/cm or less, and even more preferably 55 dyn/cm or less, from the standpoint of inhibiting blocking between the supports in the production.

The surface tension can be measured in accordance with JIS K 6768, Plastic-Film and Sheeting-Determination of Wetting Tension, using a wetting tension test solution (a mixture for wetting tension tests produced by Wako Pure Chemical Co., Ltd.). The surface tension can be adjusted by selecting a support material or adding an additive such as a light reflector and a light absorber.

In one preferable embodiment of the present invention, the total light transmittance of the support is preferably 30% or less. When the total light transmittance of the support takes such a value, the radio wave absorber exhibits excellent light resistance. The upper limit of the total light transmittance is preferably 20%, and more preferably 16%. The lower limit of the total light transmittance is not particularly limited, and is, for example, 0.01% or more, preferably 0.05% or more, and more preferably 0.1% or more.

The total light transmittance can be measured using a haze meter (NDH-4000 produced by Nippon Denshoku Industries Co., Ltd., or a similar equipment) in accordance with JIS K7105. The above total light transmittance can be adjusted by selecting the material of the support and adding an additive such as a light reflector and a light absorber.

The support preferably comprises a light reflector to satisfy the ranges of surface tension and total light transmittance. The light reflector may be mixed with a support material (such as the resin mentioned above), or included in the coating layer that forms the support surface. The light reflector is preferably in a state mixed with the support material (the resin mentioned above).

The light reflector is not particularly limited as long as the light reflector is capable of reflecting or scattering ultraviolet light or visible light (particularly ultraviolet light) and does not significantly degrade the radio wave absorption performance of the radio wave absorber of the present invention even if it is contained in the support. For example, an inorganic powder can be used.

The average particle size of the inorganic powder is preferably 50 to 400 nm, more preferably from 60 to 390 nm, and even more preferably from 70 to 380 nm, from the standpoint of satisfying the ranges of surface tension and total light transmittance.

Examples of the inorganic powder include metal oxides, such as titanium dioxide and zinc oxide. Of these, from the standpoint of easily adjusting the total light transmittance due to large refractive index and large light scattering, titanium dioxide is preferred.

The average particle size of zinc oxide applied as the light reflector is preferably 50 to 400 nm, more preferably 60 to 390 nm, and even more preferably 70 to 380 nm, from the standpoint of satisfying the ranges of surface tension and total light transmittance.

Examples of commercially available zinc oxides applied as light reflectors include MZ-300 (without a surface treatment agent, particle size: 30 to 40 nm, Teika Co., Ltd.), MZ-303S (treated with methicon, particle size: 30 to 40 nm, Teika Co., Ltd.), MZ-303M (treated with dimethicone, particle size: 30 to 40 nm, produced by Teika Co., Ltd.), MZ-500 (without a surface treatment agent, particle size: 20 to 30 nm, Teika Co., Ltd.), MZ-505S (treated with methicone, particle size: 20 to 30 nm, Teika Co., Ltd.), MZ-505M (treated with dimethicone, particle size: 20 to 30 nm, Teika Co., Ltd.), MZ-700 (without a surface treatment agent, particle size: 10 to 20 nm, Teika Co. Ltd.), MZ-707S (treated with methicon, particle size: 10 to 20 nm, Teika Co., Ltd.), FINEX-25 (without a surface treatment agent, particle size: 60 nm, produced by Sakai Chemical), FINEX-25LP (treatment with dimethicone, particle size: 60 nm, Sakai Chemical Co., Ltd.), FINEX-50 (without a surface treatment agent, particle size: 20 nm, Sakai Chemical Co., Ltd.), FINEX-50LP (treated with dimethicone, particle size: 20 nm, Sakai Chemical Co., Ltd.), and FINEX-75 (without surface treatment agent, particle size: 10 nm, produced by Sakai Chemical Co., Ltd.).

The average particle size of the titanium dioxide applied as a light reflector is preferably 50 to 400 nm, more preferably 60 to 390 nm, and even more preferably 70 to 380 nm, from the standpoint of satisfying the ranges of surface tension and total light transmittance.

Examples of titanium dioxide applied as a light reflector include Tipek CR-50 (treated with aluminum oxide, particle size: 25 nm, produced by Ishihara Sangyo Co., Ltd.), Bayer Titanium R-KB-1 (treated with zinc oxide, aluminum oxide, and silicon dioxide, particle size: 30 nm to 40 nm, produced by Bayer AG), Tipek TTO-M-1 (treated with zirconium oxide and aluminum oxide, particle size: 10 nm to 25 nm, produced by Ishihara Sangyo Co. Bayer), Taipek TTO-D-1 (treated with zirconium oxide and aluminum oxide, particle size: 20 nm to 30 nm, produced by Ishihara Sangyo Co., Ltd.), Solavert CT-100, Solavert CT-200, Solavert CT-300, Solavert CT-434 (produced by Crowder Japan Co., Ltd.), STR-100 series, and STR-40 (produced by Sakai Chemical Co., Ltd.). However, the examples are not limited to these.

Examples of the method for adjusting the surface tension and total light transmittance described above include a method comprising applying a paint containing a light absorber to the surface of the support, in addition to the method of adding a light reflector as described above. Examples of the method for adjusting the surface tension include a method of performing a corona discharge treatment, an external beam irradiation treatment, an ozone treatment, and a plasma treatment on the target surface, and a method of applying a coating agent.

The layer structure of the support is not particularly limited. The support may be composed of a single support or a combination of two or more supports.

2.5 Layer Structure

When the radio wave absorber according to the present invention includes a resistive film, a dielectric layer, and a reflective layer, the layers are arranged in such an order as to enable the radio wave absorber to exhibit radio wave absorption performance. In an embodiment, the resistive film, the dielectric layer, and the reflective layer are arranged in this order.

When the radio wave absorber according to the present invention includes a support, in an embodiment, the support, the resistive film, the dielectric layer, and the reflective layer are arranged in this order.

The radio wave absorber according to the present invention may include another layer in addition to the support, the resistive film, the dielectric layer, and the reflective layer. Another layer may be stacked on one surface of the support, the resistive film, the dielectric layer, and/or the reflective layer.

3. Radio Wave Absorption Against Oblique Incidence

Since the radio wave absorber according to the present invention has the characteristics of the present invention (specific characteristics at 45° incidence), excellent radio wave absorption against incidence from various angles (when the radio wave absorber has characteristic A, particularly incidence of TM polarization; and when the radio wave absorber has characteristic B, particularly incidence of TE polarization), particularly oblique incidence of radio waves at around 79 GHz (e.g., 75 to 85 GHz) (when the radio wave absorber has characteristic A, particularly incidence of TM polarization; and when the radio wave absorber has characteristic B, particularly incidence of TE polarization) can be exhibited.

Examples of the radio wave absorption of the radio wave absorber according to the present invention include the following.

The absorption range in each of the following examples can be measured by the method described below.

A radio wave absorption measurement device was configured by using an N5227A PNA microwave network analyzer (produced by Keysight Technologies), an N5261A millimeter wave controller for PNA-X series 2-port (produced by Keysight Technologies), and a FSS-07 horn antenna (produced by HVS). The amount of radio wave absorption of the radio wave absorbers is measured in an E band (60 to 90 GHz) by using this radio wave absorption measurement device in accordance with JIS R1679.

A radio wave is made incident at 20° or 60° relative to the front surface of a measurement sample, and a horn antenna is set at an equal angle relative to the vertical line of the center of the surface of the measurement sample, thereby determining the return loss.

For the measurement of characteristic A, the incident wave is measured with the electric field being horizontal to the plane of incidence (TM wave).

For the measurement of characteristic B, the incident wave is measured with the electric field being perpendicular to the plane of incidence (TE wave).

The absolute value of the return loss is determined to be absorption performance.

The radio wave absorber A of the present invention preferably exhibits radio wave absorption (radio wave absorption 1A), i.e., the absorption range with absorption performance of 10 dB or more (preferably 15 dB or more) within the frequency band of 75 to 85 GHz being 2 GHz or more in a TM polarization measurement at 20° incidence. The absorption range in radio wave absorption 1A is preferably 4 GHz or more, more preferably 6 GHz or more, still more preferably 8 GHz or more, and yet more preferably 9.5 GHz or more.

The radio wave absorber A of the present invention preferably exhibits radio wave absorption (radio wave absorption 2A), i.e., the absorption range with absorption performance of 10 dB or more (preferably 15 dB or more) within the frequency band of 75 to 85 GHz being 2 GHz or more in a TM polarization measurement at 60° incidence.

The absorption range in radio wave absorption 2A is preferably 4 GHz or more, more preferably 6 GHz or more, still more preferably 8 GHz or more, and yet more preferably 9.5 GHz or more.

The radio wave absorber B of the present invention preferably exhibits radio wave absorption (radio wave absorption 1B), i.e., the absorption range with absorption performance of 10 dB or more (preferably 15 dB or more) within the frequency band of 75 to 85 GHz being 4 GHz or more in a TE polarization measurement at 20° incidence. The absorption range in radio wave absorption 1B is preferably 6 GHz or more, more preferably 8 GHz or more, still more preferably 9 GHz or more, and yet more preferably 9.5 GHz or more.

The radio wave absorber B of the present invention preferably exhibits radio wave absorption (radio wave absorption 2B), i.e., the absorption range with absorption performance of 10 dB or more (preferably 15 dB or more) within the frequency band of 75 to 85 GHz being 4 GHz or more in a TE polarization measurement at 60° incidence. The absorption range in radio wave absorption 2B is preferably 6 GHz or more, more preferably 8 GHz or more, still more preferably 9 GHz or more, and yet more preferably 9.5 GHz or more.

Since the above absorption range is within the frequency band of 75 to 85 GHz, the upper limit thereof is 10 GHz.

4. Production Method

The radio wave absorber according to the present invention can be obtained in accordance with or based on various methods, such as a known production method according to its structure. For example, when the radio wave absorber of the present invention comprises a resistive film, a dielectric layer, and a reflective layer, the radio wave absorber can be obtained by a method including the step of sequentially stacking the resistive film, the dielectric layer, and the reflective layer on the support.

The method for stacking layers can be any method.

The resistive film can be stacked, for example, by sputtering, vacuum deposition, ion plating, chemical vapor deposition, or pulsed laser deposition. Of these, from the standpoint of film thickness controllability, sputtering is preferable. Sputtering can be of any type; examples include DC magnetron sputtering, high-frequency magnetron sputtering, and ion beam sputtering. The sputtering device may be of a batch system or roll-to-roll system.

The dielectric layer and the reflective layer can be stacked, for example, by using the adhesiveness of the dielectric layer.

5. λ/4 Radio Wave Absorber Member

In one embodiment, the present invention relates to a λ/4 radio wave absorber member comprising a resistive film and a dielectric layer, wherein the λ/4 radio wave absorber member has characteristic A: an absorption range with absorption performance of 15 dB or more within the frequency band of 75 to 85 GHz of 4 GHz or more in a TM polarization measurement at 45° incidence when an aluminum plate with a thickness of 10 μm is stacked on the other side of the dielectric layer, and/or characteristic B: an absorption range with absorption performance of 15 dB or more within the frequency band of 75 to 85 GHz of 4 GHz or more in a TE polarization measurement at 45° incidence when an aluminum plate with a thickness of 10 μm is stacked on the other side of the dielectric layer.

In the aluminum plate having a thickness of 10 μm to be used, the surface roughness (Rz) of the surface in contact with the dielectric layer is 4 μm.

The λ/4 radio wave absorber member includes a resistive film and a dielectric layer in this order, and is a member for forming a λ/4 radio wave absorber by arranging the dielectric layer so as to come in contact with an adherend that can function as a reflective layer such as metal. The λ/4 radio wave absorber member further includes a support. In this case, the λ/4 radio wave absorber member includes a support, a resistive film, and a dielectric layer in this order. The support, the resistive film, the dielectric layer, the characteristics of the present invention, and other configurations are as explained for the λ/4 radio wave absorber according to the present invention.

6. Application

Due to its ability to absorb unnecessary radio waves, the radio wave absorber according to the present invention can be preferably used in order to reduce radio wave interference and noise in an intelligent transport system (ITS) that communicates between automobiles, roads, and people, and in the millimeter-wave radar for use in automotive collision avoidance systems. The radio wave absorber according to the present invention can be also used as an optical transceiver or a member for handling radio waves in the next-generation mobile communications systems (5G) and short-distance wireless transfer techniques.

Since the radio wave absorber of the present invention exhibits excellent radio wave absorption against oblique incidence, it is placed obliquely (e.g. 10 to 80° or 20 to 60°) to the direction of incidence of a radio wave to be absorbed; thus the radio wave absorber of the present invention can be suitably used.

The radio wave frequency targeted by the radio wave absorber according to the present invention is suitably 75 to 85 GHz.

EXAMPLES

The present invention is described in detail with reference to Examples below. However, the present invention is not limited to the Examples.

Examples relating to the radio wave absorber A of the present invention are as shown below.

(1A) Production of Radio Wave Absorber

Example 1A

A polyethylene terephthalate (PET) film (containing 10 wt % of $TiO_2$ with a relative permittivity of 3.4) into which titanium oxide (average article size: 200 μm) with a thickness of 125 μm was kneaded was prepared as a support.

On this PET film, a resistive film (barrier layer 1, resistive layer, barrier layer 2) with a resistance value of 260 Ω/□ was formed. First, the pressure was adjusted to 0.2 Pa by introducing a gas in which the ratio of Ar and $O_2$ was adjusted to 1:1 by DC pulse sputtering, thus forming a $SiO_2$ layer (barrier layer 1: thickness: 10 nm). Subsequently, by pulsed DC sputtering, a resistive layer with a resistance value of 255Ω/□ was formed on barrier layer 1. Sputtering was performed using an alloy (composition: molybdenum: 16.4 wt %, nickel: 55.2 wt %, chromium: 18.9 wt %, iron: 5.5 wt %, tungsten: 3.5 wt %, and silica: 0.5 wt %) as a target at an output of 0.4 kW by introducing Ar gas at a flow rate of 100 sccm to adjust the pressure to 0.12 Pa. Finally, barrier layer 2 (thickness: 5 nm) was formed in the same manner as barrier layer 1.

Subsequently, a dielectric formed of acrylic two-sided adhesive tape with a thickness of 600 μm and a relative permittivity of 2.4 was stacked on the formed barrier layer 2, and a reflective layer formed of aluminum with a thickness of 10 μm (Rz=4.0 μm) was stacked on the dielectric, thereby preparing a radio wave absorber.

Examples 2A to 5A, 7A to 11A, and Comparative Examples 1A to 4A

Radio wave absorbers were prepared in the same manner as in Example 1A, except that the resistance value of the resistive film and/or the thickness of the dielectric was changed as shown in Tables 1 and 2.

Example 6A

A radio wave absorber was obtained in the same manner as in Example 1A, except that no barrier layer was formed (resistive layer=resistive film).

Example 12A

A radio wave absorber was obtained in the same manner as in Example 5A, except that the reflective layer was changed to a copper plate (Rz=0.9 μm) having a thickness of 10 μm.

Example 13A

A radio wave absorber was obtained in the same manner as in Example 5A, except that the reflective layer was changed to a copper plate (Rz=12 μm) having a thickness of 10 μm.

Example 14A

A radio wave absorber was obtained in the same manner as in Example 5A, except that the support was changed to a polyethylene terephthalate (PET) film (relative permittivity: 3.2, surface tension: 36 dyn/cm). $N_2$ gas was introduced into a atmospheric pressure plasma system (AP/TO2, direct electrode type, produced by Sekisui Chemical Co., Ltd.) as a treatment gas to generate plasma gas at an input power of 900 W (140 V, 6.4 A). The gas was transferred at a rate of 15 m/min, and subjected to a plasma treatment to adjust the surface tension of the support surface. The slit area for plasma treatment was 200 $mm^2$ (200 mm in the width direction and 1 mm in the length direction in the film).

Example 15A

A 125 μm-thick polyethylene terephthalate (PET) film ($TiO_2$; 7 wt %) into which titanium oxide (average particle size: 200 μm) was kneaded was prepared. A liquid material for hard coating was applied to the surface of the support not facing the resistive layer using a bar coater, and the coating film was further heated and dried at 100° C. for 1 minute using a dryer oven. Subsequently, by irradiating the dried coating film with ultraviolet light (irradiation amount: 300 $mJ/cm^2$), a hard coat layer with a thickness of 2 μm was placed on the support.

As a hard coat material, a liquid material for hard coating (solid concentration: 40 wt %) was prepared by adding a mixed solvent obtained by mixing toluene and methyl isobutyl ketone (MIBK) at a ratio of 5:5 (weight ratio) to a photopolymerizer-containing acrylic oligomer, and used.

A radio wave absorber was obtained in the same manner as in Example 5A, except that a PET film with the produced hard coat layer (relative permittivity: 3.4, surface tension: 32 dyn/cm) was used as a support.

(2A) Measurement of Characteristics

In a TM polarization measurement at 45° incidence, the absorption range with absorption performance of 15 dB or more within the frequency band of 75 to 85 GHz was measured. Specifically, the following measurement was conducted. A radio wave absorption measurement device was configured by using an N5227A PNA microwave network analyzer (produced by Keysight Technologies), an N5261A millimeter wave controller for PNA-X series 2-port (produced by Keysight Technologies), and a FSS-07 horn antenna (produced by HVS). The amount of radio wave absorption of the obtained radio wave absorbers was measured in an E band (60 to 90 GHz) by using this radio wave absorption measurement device in accordance with JIS R1679.

A radio wave was made incident at 45° relative to the front surface of a measurement sample, and a horn antenna was set at an equal angle relative to the vertical line of the center of the surface of the measurement sample, thereby determining the return loss.

The incident wave was measured with the electric field being horizontal to the plane of incidence (TM wave).

The absolute value of the return loss is determined to be absorption performance.

(3A) Evaluation of Radio Wave Absorption Against Oblique Incidence

Radio wave absorption against oblique incidence was evaluated. The specific evaluation method is detailed below. The measurement was performed in the same manner as in the TM polarization measurement at 45° incidence, except that the incident angle of the TM wave and the angle of the horn antenna were both changed. The absorption range with absorption performance of 10 dB or more within the frequency band of 75 to 85 GHz was measured.

(4A) Evaluation of Adhesive Force (Between Dielectric Layer and Reflective Layer)

Each of the obtained radio wave absorbers (Examples 5A, 12A, and 13A) was cut into 10-mm-wide strips to prepare a test specimen, and the surface of the dielectric layer not facing the reflective layer was exposed. The exposed surface was fixed onto the table of a measurement device with two-sided adhesive tape (9708, produced by The 3M Company). The reflective layer of this test sample was subjected to a tensile test at a peeling rate of 300 mm/min at an angle of 180° based on JIS Z0237, thereby measuring a 180-degree adhesive force (N/10 mm). An adhesive force between the dielectric layer and the reflective layer of 5 N/10 mm or more was rated B, with less than 5 N/10 mm being rated C.

(5A) Evaluation of Anti-Staining Property (Radio Wave Absorption after Oil Stains were Wiped Off)

A drop of salad oil was added with a dropper to the surface of the support not facing the resistive film in the radio wave absorber, and then the surface was rubbed back and forth 20 times with a wiper containing ligroin (product name: Clean Wiper SF30C produced by Kuraray Co., Ltd.). Thereafter, the change in radio wave absorption at 79 GHz and 45° incidence was measured in the same manner as in the (2A) measurement of characteristics section, and the case where the change was 5 dB or less was rated B, and the case where the change was more than 5 dB was rated C.

(6A) Evaluation of Light Resistance

The radio wave absorber was exposed to light for 1000 hours using a sunshine weather meter (S-80, produced by Suga Testing Machine Co., Ltd.) under a sunshine carbon arc lamp and with relative humidity of 60%. Thereafter, the change in radio wave absorption at 79 GHz and 45° incidence was measured in the same manner as in the (2A) measurement of characteristics section, and the case where the change was 5 dB or less was rated B, and the case where the change was more than 5 dB was rated C.

The results are shown in Tables 1 to 4.

TABLE 1

| | | Example 1A | Example 2A | Example 3A | Example 4A | Example 5A | Example 6A | Example 7A | Example 8A | Example 9A | Example 10A | Example 11A |
|---|---|---|---|---|---|---|---|---|---|---|---|---|
| Structure | Relative permittivity of support | 3.4 | 3.4 | 3.4 | 3.4 | 3.4 | 3.4 | 3.4 | 3.4 | 3.4 | 3.4 | 3.4 |
| | Thickness of support (μm) | 125 | 125 | 125 | 125 | 125 | 125 | 125 | 125 | 125 | 125 | 125 |
| | Resistance of resistive film Ω/□ | 260 | 260 | 260 | 355 | 175 | 255 | 190 | 220 | 220 | 300 | 300 |
| | Relative permittivity of dielectric | 2.4 | 2.4 | 2.4 | 2.4 | 2.4 | 2.4 | 2.4 | 2.4 | 2.4 | 2.4 | 2.4 |
| | Thickness of dielectric (μm) | 600 | 500 | 730 | 600 | 600 | 600 | 480 | 720 | 460 | 650 | 650 |
| | Thickness of dielectric layer (μm) × √ Relative permittivity | 930 | 775 | 1131 | 930 | 930 | 930 | 743.6128 | 1115.419 | 712.6289 | 1006.976 | 1006.976 |
| | Presence or absence of barrier layer | ○ | ○ | ○ | ○ | ○ | x | ○ | ○ | ○ | ○ | ○ |
| | Characteristic (GHz) | 10 | 5 | 5 | 6 | 5 | 10 | 4 | 6 | 4 | 10 | 4 |
| Evaluation | Radio wave absorption against oblique incidence (the bandwidth (GHz) showing absorption performance of 10 dB within 75 to 85 GHz) at 20° incidence | 10 | 10 | 2 | 10 | 4 | 10 | 10 | 4 | 8 | 10 | 10 |
| | at 60° incidence | 10 | 6 | 10 | 2 | 10 | 10 | 10 | 10 | 10 | 10 | 10 |

TABLE 2

| | | Comp. Ex. 1A | Comp. Ex. 2A | Comp. Ex. 3A | Comp. Ex. 4A |
|---|---|---|---|---|---|
| Structure | Relative permittivity of support | 3.4 | 3.4 | 3.4 | 3.4 |
| | Thickness of support (μm) | 125 | 125 | 125 | 125 |
| | Resistance of resistive film Ω/□ | 260 | 260 | 380 | 150 |

TABLE 2-continued

|  |  | Comp. Ex. 1A | Comp. Ex. 2A | Comp. Ex. 3A | Comp. Ex. 4A |
|---|---|---|---|---|---|
| Structure | Relative permittivity of dielectric | 2.4 | 2.4 | 2.4 | 2.4 |
|  | Thickness of dielectric (μm) | 450 | 770 | 600 | 600 |
|  | Thickness of dielectric layer (μm) × √ Relative permittivity | 697 | 1193 | 930 | 930 |
|  | Presence or absence of barrier layer | ○ | ○ | ○ | ○ |
| Evaluation | Characteristic (GHz) | 1 | 1 | 0 | 0 |
|  | Radio wave absorption against oblique incidence (the bandwidth (GHz) showing absorption performance of 10 dB within 75 to 85 GHz) at 20° incidence | 10 | 0 | 10 | 0 |
|  | at 60° incidence | 0 | 10 | 0 | 10 |

TABLE 3

|  |  | Example 5A | Example 12A | Example 13A |
|---|---|---|---|---|
| Structure | Relative permittivity of support | 3.4 | 3.4 | 3.4 |
|  | Thickness of support (μm) | 125 | 125 | 125 |
|  | Resistance of resistive film Ω/□ | 175 | 175 | 175 |
|  | Relative permittivity of dielectric | 2.4 | 2.4 | 2.4 |
|  | Thickness of dielectric (μm) | 600 | 600 | 600 |
|  | Thickness of dielectric layer (μm) × √ Relative permittivity | 930 | 930 | 930 |
|  | Presence or absence of barrier layer | ○ | ○ | ○ |
|  | Roughness of reflective layer | 4 | 0.9 | 12 |
| Evaluation | Characteristic (GHz) | 5 | 5 | 3 |
|  | Radio wave absorption against oblique incidence (the bandwidth (GHz) showing absorption performance of 10 dB within 75 to 85 GHz) at 20° incidence | 4 | 4 | 4 |
|  | at 60° incidence | 10 | 10 | 10 |
|  | Adhesive force (dielectric layer/reflective layer) | B | C | B |

TABLE 4

|  |  | Example 5A | Example 14A | Example 15A |
|---|---|---|---|---|
| Structure | Relative permittivity of support | 3.4 | 3.2 | 3.4 |
|  | Thickness of support (μm) | 125 | 125 | 125 |
|  | Resistance of resistive film Ω/□ | 175 | 175 | 175 |
|  | Relative permittivity of dielectric | 2.4 | 2.4 | 2.4 |
|  | Thickness of dielectric (μm) | 600 | 600 | 600 |
|  | Thickness of dielectric layer (μm) × √ Relative permittivity | 930 | 930 | 930 |
|  | Presence or absence of barrier layer | ○ | ○ | ○ |
|  | dyn value of support | 40 | 36 | 32 |
|  | Total light transmittance | 11 | 89 | 16 |
| Evaluation | Characteristic (GHz) | 5 | 5 | 5 |
|  | Radio wave absorption against oblique incidence (the bandwidth (GHz) showing absorption performance of 10 dB within 75 to 85 GHz) at 20° incidence | 4 | 4 | 4 |
|  | at 60° incidence | 10 | 10 | 10 |
|  | Anti-staining property | B | B | C |
|  | Light resistance | B | C | B |

Examples relating to the radio wave absorber B of the present invention are as shown below.
(1B) Production of Radio Wave Absorber Example 1B A polyethylene terephthalate (PET) film (containing 10 wt % of $TiO_2$ with a relative permittivity of 3.4) into which titanium oxide (average article size: 200 μm) with a thickness of 125 μm was kneaded was prepared as a support.

On this PET film, a resistive film (barrier layer 1, resistive layer, barrier layer 2) with a resistance value of 490 Ω/□ was formed in the following manner. First, the pressure was adjusted to 0.2 Pa by introducing a gas in which the ratio of Ar and $O_2$ was adjusted to 1:1 by DC pulse sputtering, thus forming a $SiO_2$ layer (barrier layer 1: thickness: 10 nm). Subsequently, by pulsed DC sputtering, a resistive layer with a resistance value of 485Ω/□ was formed on barrier layer 1. Sputtering was performed using an alloy (composition: molybdenum: 16.4 wt %, nickel: 55.2 wt %, chromium: 18.9 wt %, iron: 5.5 wt %, tungsten: 3.5 wt %, and silica: 0.5 wt %) as a target at an output of 0.4 kW by introducing Ar gas at a flow rate of 100 sccm to adjust the pressure to 0.12 Pa. Finally, barrier layer 2 (thickness: 5 nm) was formed in the same manner as the barrier layer 1.

Subsequently, a dielectric formed of acrylic adhesive tape having a thickness of 530 μm and a relative permittivity of 2.4 was stacked on the formed barrier layer 2, and a reflective layer formed of aluminum with a thickness of 10 μm (Rz=4.0 μm) was stacked on the dielectric, thereby preparing a radio wave absorber.

Examples 2B to 5B, 7B to 12B, and Comparative Examples 1B to 4B

Radio wave absorbers were prepared in the same manner as in Example 1B, except that the resistance value of the resistive film and/or the thickness of the dielectric were changed as shown in Tables 5 and 6.

Example 6B

A radio wave absorber was obtained in the same manner as in Example 1B, except that no barrier layer was formed (resistive layer=resistive film).

Example 13B

A radio wave absorber was obtained in the same manner as in Example 4B, except that the reflective layer was changed to a copper plate (Rz=0.9 μm) having a thickness of 10 μm.

Example 14B

A radio wave absorber was obtained in the same manner as in Example 4B, except that the reflective layer was changed to a copper plate (Rz=12 μm) having a thickness of 10 μm.

Example 15B

A radio wave absorber was obtained in the same manner as in Example 4B, except that the support was changed to a polyethylene terephthalate (PET) film (relative permittivity: 3.2, surface tension: 36 dyn/cm). $N_2$ gas was introduced into an atmospheric pressure plasma system (AP/TO2, direct electrode type, produced by Sekisui Chemical Co., Ltd.) as a treatment gas to generate plasma gas at an input power of 900 W (140 V, 6.4 A). The gas was transferred at a rate of 15 m/min, and subjected to a plasma treatment to adjust the surface tension of the support surface. The slit area for plasma treatment was 200 mm$^2$ (200 mm in the width direction and 1 mm in the length direction in the film).

Example 16B

A 125 μm-thick polyethylene terephthalate (PET) film ($TiO_2$; 7 wt %) into which titanium oxide (average particle size: 200 μm) was kneaded was prepared. A liquid material for hard coating was applied to the surface of the support not facing the resistive layer using a bar coater, and the coating film was further heated and dried at 100° C. for 1 minute using a dryer oven. Subsequently, by irradiating the dried coating film with ultraviolet light (irradiation amount: 300 mJ/cm$^2$), a hard coat layer with a thickness of 2 μm was placed on the support.

As a hard coat material, a liquid material for hard coating (solid concentration: 40 wt %) was prepared by adding a mixed solvent obtained by mixing toluene and methyl isobutyl ketone (MIBK) at a ratio of 5:5 (weight ratio) to a photopolymerizer-containing acrylic oligomer, and used.

A radio wave absorber was obtained in the same manner as in Example 4B, except that a PET film with the produced hard coat layer (relative permittivity: 3.4, surface tension: 32 dyn/cm) was used as a support.

(2B) Measurement of Characteristics

In a TE polarization measurement at 45° incidence, the absorption range with absorption performance of 15 dB or more within the frequency band of 75 to 85 GHz was measured. Specifically, a radio wave absorption measurement device was configured by using an N5227A PNA microwave network analyzer (produced by Keysight Technologies), an N5261A millimeter wave controller for PNA-X series 2-port (produced by Keysight Technologies), and a FSS-07 horn antenna (produced by HVS). The amount of radio wave absorption of the obtained radio wave absorbers was measured in an E band (60 to 90 GHz) by using this radio wave absorption measurement device in accordance with JIS R1679.

A radio wave was made incident at 45° relative to the front surface of a measurement sample, and a horn antenna was set at an equal angle relative to the vertical line of the center of the surface of the measurement sample, thereby determining the return loss. In this measurement, the incident wave was measured with the electric field of the incident wave being perpendicular to the plane of incidence (TE wave). The absolute value of the return loss is determined to be absorption performance.

(3B) Evaluation of Radio Wave Absorption Against Oblique Incidence Radio wave absorption against oblique incidence was evaluated. The specific evaluation method is detailed below. The measurement was performed in the same manner as in the TE polarization measurement at 45° incidence, except that the incident angle of the TE wave and the angle of the horn antenna were both changed. The absorption range with absorption performance of 10 dB or more within the frequency band of 75 to 85 GHz was measured.

(4B) Evaluation of Adhesive Force (Between Dielectric Layer and Reflective Layer)

Each of the obtained radio wave absorbers (Examples 4B, 13B, and 14B) was cut into 10-mm-wide strips to prepare a test specimen, and the surface of the dielectric layer not facing the reflective layer was exposed. The exposed surface was fixed onto the table of a measurement device with two-sided adhesive tape (9708, produced by The 3M Company). The reflective layer of this test sample was subjected to a tensile test at a peeling rate of 300 mm/min at an angle of 180° based on JIS Z0237, thereby measuring a 180-degree adhesive force (N/10 mm). An adhesive force between the dielectric layer and the reflective layer of 5 N/10 mm or more was rated B, with less than 5 N/10 mm being rated C.

(5B) Evaluation of Anti-Staining Property (Radio Wave Absorption after Oil Stains were Wiped Off)

A drop of salad oil was added with a dropper to the surface of the support not facing the resistive film in the radio wave absorber, and then the surface was rubbed back and forth 20 times with a wiper containing ligroin (product name: Clean Wiper SF30C produced by Kuraray Co., Ltd.) Thereafter, the change in radio wave absorption at 79 GHz and 45° incidence was measured in the same manner as in the (2B) measurement of characteristics section, and the case where the change was 5 dB or less was rated B, and the case where the change was more than 5 dB was rated C.

(6B) Evaluation of Light Resistance

A radio wave absorber was exposed to light for 1000 hours using a sunshine weather meter (S-80, produced by Suga Testing Machine Co., Ltd.) under a sunshine carbon arc lamp and with relative humidity of 60%. Thereafter, the change in radio wave absorption at 79 GHz and 45° incidence was measured in the same manner as in the (2B) measurement of characteristics section, and the case where the change was 5 dB or less was rated B, and the case where the change was more than 5 dB was rated C.

The results are shown in Tables 5 to 8.

TABLE 5

| | | Example 1B | Example 2B | Example 3B | Example 4B | Example 5B | Example 6B | Example 7B | Example 8B | Example 9B | Example 10B | Example 11B | Example 12B |
|---|---|---|---|---|---|---|---|---|---|---|---|---|---|
| Structure | Relative permittivity of support | 3.4 | 3.4 | 3.4 | 3.4 | 3.4 | 3.4 | 3.4 | 3.4 | 3.4 | 3.4 | 3.4 | 3.4 |
| | Thickness of support (μm) | 125 | 125 | 125 | 125 | 125 | 125 | 125 | 125 | 125 | 125 | 125 | 125 |
| | Resistance of resistive film Ω/☐ | 490 | 490 | 490 | 690 | 355 | 485 | 460 | 560 | 670 | 550 | 570 | 570 |
| | Relative permittivity of dielectric | 2.4 | 2.4 | 2.4 | 2.4 | 2.4 | 2.4 | 2.4 | 2.4 | 2.4 | 2.4 | 2.4 | 2.4 |
| | Thickness of dielectric (μm) | 530 | 440 | 620 | 530 | 530 | 530 | 455 | 460 | 480 | 620 | 580 | 500 |
| | Thickness of dielectric layer (μm) × √ Relative permittivity | 821 | 682 | 960 | 821 | 821 | 821 | 705 | 713 | 744 | 960 | 899 | 775 |

TABLE 5-continued

|  |  |  | Example 1B | Example 2B | Example 3B | Example 4B | Example 5B | Example 6B | Example 7B | Example 8B | Example 9B | Example 10B | Example 11B | Example 12B |
|---|---|---|---|---|---|---|---|---|---|---|---|---|---|---|
| Evaluation | Presence or absence of barrier layer | | ○ | ○ | ○ | ○ | ○ | x | ○ | ○ | ○ | ○ | ○ | ○ |
| | Characteristic (GHz) | | 10 | 4 | 4 | 5 | 4 | 10 | 6 | 5 | 4 | 4 | 6 | 10 |
| | Radio wave absorption against oblique incidence (the bandwidth (GHz) showing absorption performance of 10 dB within 75 to 85 GHz) | at 20° incidence | 10 | 10 | 5 | 4 | 10 | 10 | 10 | 10 | 10 | 10 | 9 | 10 |
| | | at 60° incidence | 10 | 5 | 10 | 10 | 4 | 10 | 6 | 8 | 9 | 4 | 10 | 10 |

TABLE 6

|  |  |  | Comp. Ex. 1B | Comp. Ex. 2B | Comp. Ex. 3B | Comp. Ex. 4B |
|---|---|---|---|---|---|---|
| Structure | Relative permittivity of support | | 3.4 | 3.4 | 3.4 | 3.4 |
| | Thickness of support (μm) | | 125 | 125 | 125 | 125 |
| | Resistance of resistive film Ω/□ | | 490 | 490 | 750 | 300 |
| | Relative permittivity of dielectric | | 2.4 | 2.4 | 2.4 | 2.4 |
| | Thickness of dielectric (μm) | | 640 | 400 | 530 | 530 |
| | Thickness of dielectric layer (μm) × √ Relative permittivity | | 991 | 620 | 821 | 821 |
| | Presence or absence of barrier layer | | ○ | ○ | ○ | ○ |
| Evaluation | Characteristic (GHz) | | 1 | 0 | 0 | 0 |
| | Radio wave absorption against oblique incidence (the bandwidth (GHz) showing absorption performance of 10 dB within 75 to 85 GHz) | at 20° incidence | 3 | 8 | 0 | 10 |
| | | at 60° incidence | 8 | 0 | 10 | 0 |

TABLE 7

|  |  |  | Example 4B | Example 13B | Example 14B |
|---|---|---|---|---|---|
| Structure | Relative permittivity of support | | 3.4 | 3.4 | 3.4 |
| | Thickness of support (μm) | | 125 | 125 | 125 |
| | Resistance of resistive film Ω/□ | | 690 | 690 | 690 |
| | Relative permittivity of dielectric | | 2.4 | 2.4 | 2.4 |
| | Thickness of dielectric (μm) | | 530 | 530 | 530 |
| | Thickness of dielectric layer (μm) × √ Relative permittivity | | 821 | 821 | 821 |
| | Presence or absence of barrier layer | | ○ | ○ | ○ |
| | Roughness of reflective layer | | 4.0 | 0.9 | 12 |
| Evaluation | Characteristic (GHz) | | 5 | 5 | 5 |
| | Radio wave absorption against oblique incidence (the bandwidth (GHz) showing absorption performance of 10 dB within 75 to 85 GHz) | at 20° incidence | 4 | 4 | 4 |
| | | at 60° incidence | 10 | 10 | 10 |
| | Adhesive force (dielectric layer/reflective layer) | | B | C | B |

TABLE 8

|  |  |  | Example 4B | Example 15B | Example 16B |
|---|---|---|---|---|---|
| Structure | Relative permittivity of support | | 3.4 | 3.2 | 3.4 |
| | Thickness of support (μm) | | 125 | 125 | 125 |
| | Resistance of resistive film Ω/□ | | 690 | 690 | 690 |
| | Relative permittivity of dielectric | | 2.4 | 2.4 | 2.4 |
| | Thickness of dielectric (μm) | | 530 | 530 | 530 |
| | Thickness of dielectric layer (μm) × √ Relative permittivity | | 821 | 821 | 821 |
| | Presence or absence of barrier layer | | ○ | ○ | ○ |
| | dyn value of support | | 40 | 36 | 32 |
| | Total light transmittance | | 11 | 89 | 16 |
| Evaluation | Characteristic (GHz) | | 5 | 5 | 5 |
| | Radio wave absorption against oblique incidence (the bandwidth (GHz) showing absorption performance of 10 dB within 75 to 85 GHz) | at 20° incidence | 4 | 4 | 4 |
| | | at 60° incidence | 10 | 10 | 10 |
| | Anti-staining property | | B | B | C |
| | Light resistance | | B | C | B |

DESCRIPTION OF THE REFERENCE NUMERALS 1 support
2 resistive film
3 dielectric layer
4 reflective layer
5 adhesive layer
6 chassis

The invention claimed is:
1. A radio wave absorber having
    characteristic A: an absorption range with absorption performance of 15 dB or more within the frequency band of 75 to 85 GHz with a bandwidth of 4 GHz or more in a transverse magnetic (TM) polarization measurement at 45° incidence, and/or characteristic B: an absorption range with absorption performance of 15 dB or more within the frequency band of 75 to 85 GHz with a bandwidth of 4 GHz or more in a transverse electric (TE) polarization measurement at 45° incidence, wherein when the radio wave absorber has characteristic A, the radio wave absorber has an absorption range with absorption performance of 10 dB or more within the frequency band of 75 to 85 GHz with a bandwidth of 2 GHz or more in a TM polarization measurement at 20° incidence, and an absorption range with absorption performance of 10 dB or more within the frequency band of 75 to 85 GHz with a bandwidth of 2 GHz or more in a TM polarization measurement at 60° incidence, wherein when the radio wave absorber has characteristic B, the radio wave absorber has an absorption range with absorption performance of 10 dB or more within the frequency band of 75 to 85 GHz with a bandwidth of 4 GHz or more in a TE polarization measurement at 20° incidence, and an absorption range with absorption performance of 10 dB or more within the frequency band of 75 to 85 GHz with a bandwidth of 4 GHz or more in a TE polarization measurement at 60° incidence.

2. The radio wave absorber according to claim 1, comprising a resistive film, a dielectric layer, and a reflective layer.

3. The radio wave absorber according to claim 2, wherein the radio wave absorber has characteristic A, and the resistive film has a resistance value of 175Ω/□ to 360 Ω/□.

4. The radio wave absorber according to claim 2, wherein the radio wave absorber has characteristic B, and the resistive film has a resistance value of 355Ω/□ to 690 Ω/□.

5. The radio wave absorber according to claim 2, wherein the radio wave absorber has characteristic A and satisfies the following formula (1A):

$$700 \le d \times \sqrt{\varepsilon} \le 1150 \quad (1A),$$

wherein d represents the thickness (μm) of the dielectric layer and ε represents the relative permittivity of the dielectric layer.

6. The radio wave absorber according to claim 2, wherein the radio wave absorber has characteristic B and satisfies the following formula (1B):

$$682 \le d \times \sqrt{\varepsilon} 960 \quad (1B),$$

wherein d represents the thickness (μm) of the dielectric layer and ε represents the relative permittivity of the dielectric layer.

7. The radio wave absorber according to claim 2, wherein the dielectric layer has a relative permittivity of 1 to 10.

8. The radio wave absorber according to claim 2, wherein the resistive film comprises a barrier layer.

9. The radio wave absorber according to claim 2, wherein the resistive film contains molybdenum.

10. The radio wave absorber according to claim 9, wherein the resistive film further contains nickel and chromium.

11. The radio wave absorber according to claim 2, wherein the surface of the reflective layer facing the dielectric layer has a surface roughness (Rz) of 1 μm or more and 10 μm or less.

12. The radio wave absorber according to claim 2, further comprising a support, wherein the top surface of the radio wave absorber facing the support has a surface tension of 35 dyne/cm or more.

13. The radio wave absorber according to claim 12, wherein the support has a total light transmittance of 30% or less.

14. A λ/4 radio wave absorber member comprising a resistive film and a dielectric layer, the λ/4 radio wave absorber member having characteristic A: an absorption range with absorption performance of 15 dB or more within the frequency band of 75 to 85 GHz with a bandwidth of 4 GHz or more in a transverse magnetic (TM) polarization measurement at 45° incidence when an aluminum plate with a thickness of 10 μm is stacked on the other side of the dielectric layer, and/or characteristic B: an absorption range with absorption performance of 15 dB or more within the frequency band of 75 to 85 GHz with a bandwidth of 4 GHz or more in a transverse electric (TE) polarization measurement at 45° incidence when an aluminum plate with a thickness of 10 μm is stacked on the other side of the dielectric layer, wherein when the λ/4 radio wave absorber member has characteristic A, the radio wave absorber has an absorption range with absorption performance of 10 dB or more within the frequency band of 75 to 85 GHz with a bandwidth of 2 GHz or more in a TM polarization measurement at 20° incidence when an aluminum plate with a thickness of 10 μm is stacked on the other side of the dielectric layer, and an absorption range with absorption performance of 10 dB or more within the frequency band of 75 to 85 GHz with a bandwidth of 2 GHz or more in a TM polarization measurement at 60° incidence when an aluminum plate with a thickness of 10 μm is stacked on the other side of the dielectric layer, wherein when the λ/4 radio wave absorber member has characteristic B, the radio wave absorber has an absorption range with absorption performance of 10 dB or more within the frequency band of 75 to 85 GHz with a bandwidth of 4 GHz or more in a TE polarization measurement at 20° incidence when an aluminum plate with a thickness of 10 m is stacked on the other side of the dielectric layer, and an absorption range with absorption performance of 10 dB or more within the frequency band of 75 to 85 GHz with a bandwidth of 4 GHz or more in a TE polarization measurement at 60° incidence when an aluminum plate with a thickness of 10 μm is stacked on the other side of the dielectric layer.

15. A radio wave absorber, having characteristic A: an absorption range with absorption performance of 15 dB or more within the frequency band of 75 to 85 GHz with a bandwidth of 4 GHz or more in a transverse magnetic (TM) polarization measurement at 45° incidence, and comprising a resistive film, a dielectric layer, and a reflective layer, wherein the resistive film has a resistance value of 200Ω/□ to 320Ω/□, and satisfies the following formula (1A-1):

$$880 \le d \times \sqrt{\varepsilon} \le 1050 \quad (1A-1),$$

wherein d represents the thickness (μm) of the dielectric layer and ε represents the relative permittivity of the dielectric layer, wherein the radio wave absorber has an absorption range with absorption performance of 10 dB or more within the frequency band of 75 to 85 GHz with a bandwidth of 2 GHz or more in a TM polarization measurement at 20° incidence, and an absorption range with absorption performance of 10 dB or more within the frequency band of 75 to 85 GHz with a bandwidth of 2 GHz or more in a TM polarization measurement at 60° incidence.

16. A radio wave absorber, having characteristic B: an absorption range with absorption performance of 15 dB or more within the frequency band of 75 to 85 GHz with a bandwidth of 4 GHz or more in transverse electric (TE) polarization measurement at 45° incidence, and comprising a resistive film, a dielectric layer, and a reflective layer, wherein the resistive film has a resistance value of 485Ω/□ to 670Ω/□, and satisfies the following formula (1B-1):

$$720 \leq d \times \sqrt{\varepsilon} \leq 870 \tag{1B-1},$$

wherein d represents the thickness (μm) of the dielectric layer and F represents the relative permittivity of the dielectric layer wherein the radio wave absorber has an absorption range with absorption performance of 10 dB or more within the frequency band of 75 to 85 GHz with a bandwidth of 4 GHz or more in a TE polarization measurement at 20° incidence, and an absorption range with absorption performance of 10 dB or more within the frequency band of 75 to 85 GHz with a bandwidth of 4 GHz or more in a TE polarization measurement at 60° incidence.

* * * * *